United States Patent [19]

Sinsheimer et al.

[11] Patent Number: 5,471,148
[45] Date of Patent: Nov. 28, 1995

[54] PROBE CARD CHANGER SYSTEM AND METHOD

[75] Inventors: Roger Sinsheimer, Petaluma; James Anderson, Santa Rosa, both of Calif.

[73] Assignee: Xandex, Inc., Petaluma, Calif.

[21] Appl. No.: 188,636

[22] Filed: Jan. 28, 1994

Related U.S. Application Data

[63] Continuation-in-part of Ser. No. 82,403, Jun. 24, 1993, abandoned.

[51] Int. Cl.⁶ .................................................. G01R 31/02
[52] U.S. Cl. ........................................ 324/754; 439/331
[58] Field of Search ................................... 439/331, 333; 324/754, 758

[56] References Cited

U.S. PATENT DOCUMENTS

| | | | |
|---|---|---|---|
| 4,105,970 | 8/1978 | Katz | 324/158 P |
| 4,746,855 | 5/1988 | Wrinn | 324/73 R |
| 4,757,254 | 7/1988 | Staples | 324/754 |
| 4,935,696 | 6/1990 | DiPerna | 324/158 F |
| 5,019,771 | 5/1991 | Yang et al. | 324/158 P |
| 5,030,907 | 7/1991 | Yih et al. | 324/158 F |
| 5,068,601 | 11/1991 | Parmenter | 324/754 |
| 5,254,939 | 10/1993 | Anderson et al. | 324/158 P |

OTHER PUBLICATIONS

U.S. Ser. No. 08/089,874 filed Jul. 9, 1993.
U.S. Ser. No. 08/082,403 filed Jun. 24, 1993.

Primary Examiner—Kenneth A. Wieder
Assistant Examiner—Mark Wardas
Attorney, Agent, or Firm—Townsend and Townsend and Crew

[57] ABSTRACT

A prober tester interface system is described which includes a carriage having a plurality of cam followers on its perimeter and a cam ring having a plurality of cam grooves on its interior. Positioning means are detachably coupled to the carriage for positioning the cam followers in the cam grooves. Rotating means are coupled to the cam ring for rotating the cam ring, thereby causing the cam followers to track in the cam grooves and move the carriage in a direction substantially perpendicular to the plane of the cam ring. A method is also described in which a carriage having a probe card disposed therein and a plurality of cam followers on its perimeter is positioned in a cam ring having a plurality of cam grooves located on its interior to engage the cam followers in the cam grooves. The probe card is equipped with a plurality of test pins. The cam ring is then rotated, thereby causing the cam followers to track in the cam grooves and move the carriage in a direction perpendicular to the plane of the cam ring, thereby coupling the prober card to a test head. A semiconductor wafer is then brought into contact with the test pins and probed.

21 Claims, 13 Drawing Sheets

PROBE CARD CHANGER SYSTEM AND METHOD

CROSS REFERENCE TO RELATED APPLICATION

This application is a continuation in part of commonly assigned, U.S. patent application Ser. No. 08/082,403, filed on Jun. 24, 1993, now abandoned.

BACKGROUND OF THE INVENTION

The present invention relates generally to the field of electronic test systems. More specifically, the invention provides an improved method and apparatus for performing probe tests on semiconductor wafers.

Various types of wafer test and probe equipment are well known to those of skill in the art, and are widely used in semiconductor manufacturing operations. Such equipment is used to provide electrical signals to a plurality of dies, generally formed on a semiconductor wafer, and to monitor the response of the dies to the electrical signals. Wafer test and probe equipment is made by a variety of manufacturers including, for example, Electroglas, KLA, Teradyne®, Schlumberger, and Trillium.

Semiconductor wafer testing is normally conducted prior to wafer dicing and chip packaging. The wafer is placed on a prober chuck, indexed, and each die is tested. The testing operation normally involves placing a probe card with a number of probe tips in contact with a particular die at selected locations, such as, for example, the bond pads. Predetermined voltage patterns are then applied to the die, and the response of the die to the signals is monitored. If the die exhibits an appropriate response, the die is presumed to be "good." If the monitored response falls outside performance parameters, the die is either rejected, or appropriate remedial action is taken. Such wafer tests are performed on a wide variety of semiconductor products ranging from DRAMs and SRAMs to microprocessors.

Because modern semiconductor devices are being developed to operate at higher and higher speeds, "overhead" test techniques have been developed to keep signal transmission lines as short as possible. Short transmission lines reduce cross-talk between adjacent lines and eliminate other undesirable high frequency effects. In previous overhead testing techniques, a section of the tester referred to as the test head is positioned over the wafer under test and then docked. A printed circuit board comprising a plurality of downwardly extending pins is coupled to the test head which, when docked, causes the pins to come into contact with the wafer.

While enjoying some measure of success, such prior systems have also encountered certain difficulties. One such difficulty is related to the fact that the arrangement of pins and circuitry on probe cards varies from application to application. For example, the arrangement of pins on a probe card for testing 1M DRAMs is radically different from the arrangement of pins on a probe card intended for testing of 4M DRAMs. The arrangement of pins on a DRAM probe card differs even more dramatically from the arrangement of pins on a microprocessor probe card. Therefore, when the user of a prior system desires to switch the wafer product being tested, it becomes necessary to remove and replace the currently installed probe card. This is a time consuming and difficult task for a number of reasons. First, in many systems the probe card is mounted under the test head, which must be undocked before the probe card may be removed. This proves difficult because most test heads weigh between 250 and 750 pounds. Additionally, in most systems, the interface between the test head and the probe card must be disassembled and then reassembled. Finally, recalibration of probe card and test head positioning is required after replacement of a probe card.

Under some circumstances, it may be desirable to mount additional devices, such as transistors, resistors, and capacitors on a probe card. This highlights another problem encountered by prior systems. Because the vertical clearance between the probe card and the prober elements is often extremely constrained, the user's ability to mount such devices on a probe card is limited.

As device density increases due to advances in semiconductor fabrication, probe card pin density also increases. Thus, the performance of the probe card interface system has become increasingly critical to successful device testing. In order to ensure proper contact between probe card spring contact pins (i.e., Pogo® pins) and the probe card test, a significant force between the two must be maintained. For example, in some systems, probe card pins are commonly subjected to a force of about 500 pounds or more. Because of the often delicate nature of probe card pins, numerous touchdowns may result in probe pin "drift". Thus, probe cards often require maintenance after repeated contacts with semiconductor wafers.

Conventionally, those of skill in the art have had no effective way of recording the operating history of a probe card. Therefore, contact failures only have been detected after the fact using, for example, a method such as the one disclosed by U.S. Pat. No. 5,019,771, the entire specification of which is herein incorporated by reference. Using such reactive methods, however, a probe card is replaced and/or repaired only after a failure has occurred. This results in undesirable system down time.

The problem of maintaining records on individual probe cards is made difficult by the fact that probe cards are frequently moved in and out of a testing system as described above. One solution involves manually labelling the various probe cards, and manually entering information regarding probe card usage on data sheets or into a computer. Unfortunately, this becomes difficult or impractical when large numbers of probe cards are in use. Additionally, the procedure is highly susceptible to human error.

Two systems which present specific solutions to the above-described problems are disclosed in commonly assigned U.S. Pat. No. 5,254,939 for PROBE CARD SYSTEM AND METHOD, and commonly assigned, copending U.S. patent application Ser. No. 08/089,874 for PROBE CARD SYSTEM AND METHOD, filed on Jul. 9, 1993 as a continuation of the '939 patent, the entire specifications of which are herein incorporated by reference. The systems described in the '939 patent and the pending continuation application each comprise a plurality of cassettes into which individual probe cards are placed and positioned with stepper motors in a prober-test head interface. However, because of specific industry needs, other solutions are needed.

In view of the foregoing, an improved system and method for conducting wafer probe tests is needed which provides a sturdy and reliable interface to load probe cards into a test head. An improved system and method for tracking individual probe card usage and performance is also desirable.

SUMMARY OF THE INVENTION

According to the present invention, an improved wafer testing method and prober-to-test head interface system is provided. The system, also referred to hereinafter as the "autoloader" provides for convenient loading and changing of probe cards, as well as a more effective means for positioning probe cards during test operations. The present invention is also directed to a systematic method and device for probe card dam collection.

A prober-tester interface system is described which includes a carriage having a plurality of cam followers on its perimeter and a cam ring having a plurality of cam grooves on its interior. Positioning means are detachably coupled to the carriage for positioning the cam followers in the cam grooves. Rotating means are coupled to the cam ring for rotating the cam ring, thereby causing the cam followers to track in the cam grooves and move the carriage in a direction substantially perpendicular to the plane of the cam ring.

In one embodiment, the positioning means includes an arm, one end of which is detachably coupled to the carriage. A first air cylinder is coupled to the other end of the arm for moving the carriage in a direction substantially parallel to the plane of the cam ring (also referred to herein as the "X-direction"). A second air cylinder is also coupled to the other end of the arm and to the first cylinder. The second air cylinder is for moving the carriage in a direction substantially perpendicular to the plane of the cam ring (also referred to herein as the "Z-direction"). In a specific embodiment, the carriage positioning means is selectively positionable in both the X-direction and the Z-direction, which are defined by a reference point relative to the tester. That is, the arm is selectively positionable in both the vertical and horizontal sense, to precisely locate the arm and thus the carriage at predetermined locations within the autoloader system. In one embodiment, the arm is pin connected to the carriage. In a further embodiment, the first cylinder is a band-type cylinder, and the second cylinder is a conventional air cylinder.

In a specific embodiment, the rotating means comprises a cam-locking cylinder coupled to the cam ring for rotating the cam ring when the cam-locking cylinder is actuated. In one embodiment, the cam-locking cylinder is a rodless-type air cylinder. In a more specific embodiment, the cam-locking cylinder is supplied with a predetermined supply air pressure to maintain a substantially constant rotational force on the cam ring, thereby maintaining the position of the carriage. In a further embodiment, the predetermined air pressure is at least 65 psig.

In a one embodiment of the prober tester interface system, the rotating means comprises a theta ring concentric with and adjacent the cam ring. The theta ring may be coupled to a theta motor, or a manual theta adjuster, and is for finely adjusting the angular positioning of the probe card with respect to the orientation of the wafer, i.e., the device under test.

In a generalized embodiment, the positioning means of the present invention comprises first means for moving the carriage in a direction substantially parallel to the plane of the cam ring, and second means for moving the carriage in a direction substantially perpendicular to the plane of the cam ring, thereby facilitating the loading and unloading of probe cards into the system.

In a specific embodiment, a probe card is disposed in the carriage. In a more specific embodiment, the probe card is disposed in a stiffener.

Methods for testing semiconductor wafers in a prober tester are also provided by the present invention. In one embodiment, a carnage having a probe card disposed therein and a plurality of cam followers on its perimeter is positioned in a cam ring having a plurality of cam grooves located on its interior to engage the cam followers in the cam grooves. The probe card is equipped with a plurality of test pins. The cam ring is then rotated, thereby causing the cam followers to track in the cam grooves and move the carriage in a direction perpendicular to the plane of the cam ring, thereby coupling the probe card to the test head. The semiconductor wafer device is then probed.

In a more specific embodiment, a probe card is placed into the carriage. The carriage is then made to move in a direction substantially parallel to the plane of the cam ring, the carriage moving from a position outside of the wafer tester to a position inside the prober tester. The carriage is then made to move in a direction substantially perpendicular to the plane of the cam ring.

In another embodiment of the above-described method, a key comprising a memory corresponding to the probe card is placed in a control unit. The memory is then polled for the purpose of either modifying or reading information stored in the memory. In a more specific embodiment, the memory is a serial touch memory. The memory device records various performance and operating data regarding the probe card including, for example, contact failures, the location of probes which failed, touchdowns, date of last repair/alignment, date of manufacture, and the like. The key element is coded to mate with a specific probe card and is utilized in the method of the present invention by placing the key element into the control unit. The autoloader is programmed to proceed with testing only on the condition that the key element mated to the loaded probe card has been recognized.

In one embodiment, the probe card includes auxiliary electronic devices protruding at least one-half of one inch in the direction perpendicular to the plane of the cam ring from the probe card.

Specific embodiments of the invention provide a number of additional features. For example, in various embodiments, the system allows for standardized tester interfaces, provides for probe card protection during loading, and provides for mechanized, repeatable probe tip to pad alignment. Furthermore, the autoloader assembly designed according to the present invention can be incorporated into existing wafer probe systems or designed into new systems.

A further understanding of the nature and advantages of the inventions herein may be realized by reference to the remaining portions of the specification and the attached drawings.

DESCRIPTION OF SPECIFIC EMBODIMENTS

Specific embodiments of the method and apparatus of the present invention are described herein with reference to the above-described figures and specific terms defined below.

By "arm" we mean a bracket-like extension, such as, for example, a rigid metal bracket connecting the positioner to the carriage element. The arm may have a pin/cylinder actuated connection to the carriage.

By "carriage" we mean a rigid or semi-rigid element supporting the probe card assembly. The carriage may accept an O.E.M. supplied stiffener in which the probe card is disposed.

By "cam-locking cylinder" we mean a positive displacement cylinder, preferably an air actuated piston and cylinder device providing a positive force in the direction of the cylinder length when actuated.

By "X-direction" we mean a direction parallel to the plane of the cam ring, the horizontal direction, or the direction from left to tight when viewed from the front of the wafer test prober.

By "Z-direction" we mean the direction perpendicular to the plane of the cam ring, or the vertical direction.

Figure 1:
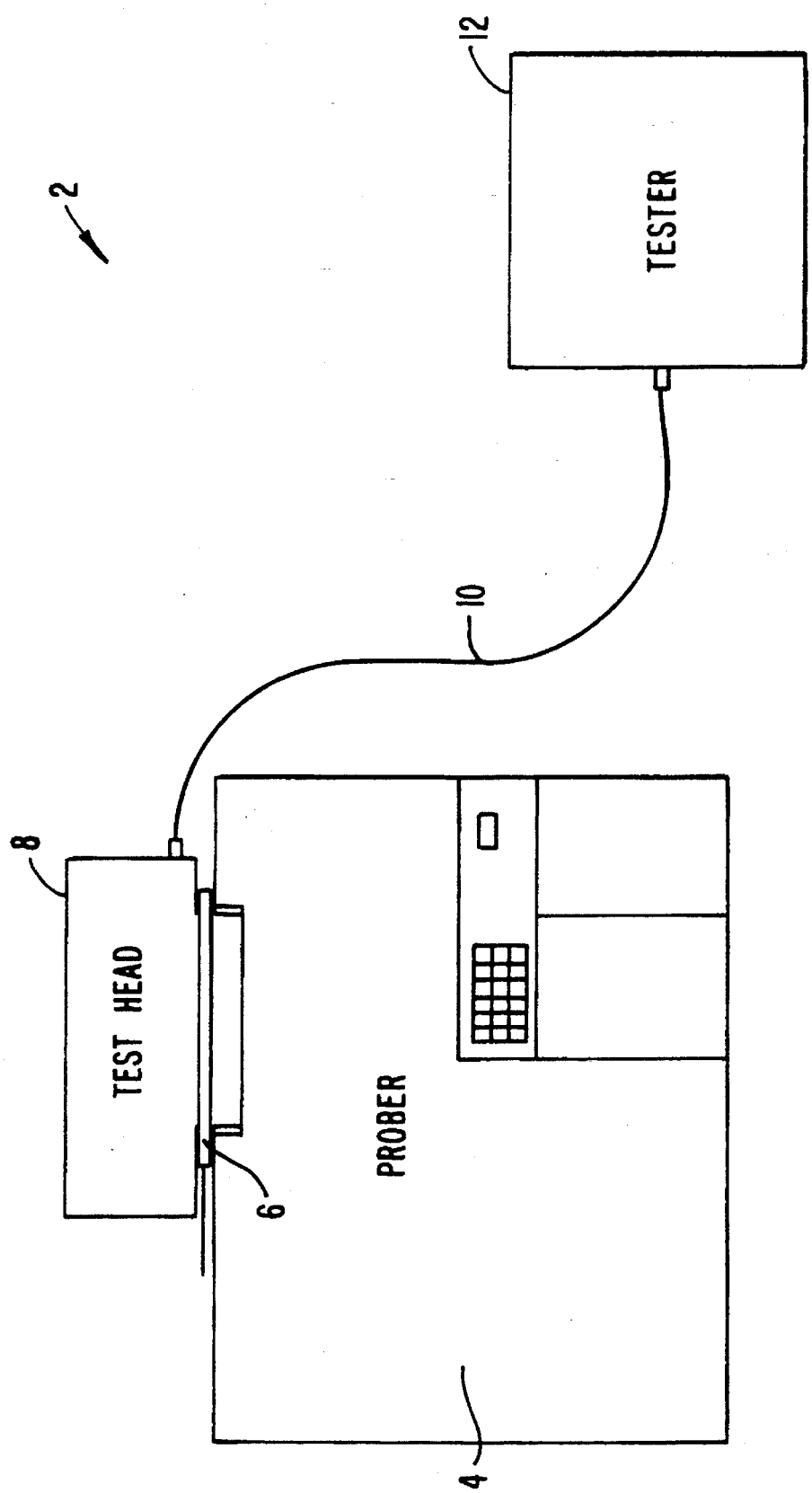
FIG. 1 is a system block diagram of a wafer probe system incorporating an autoloader designed according to one embodiment of the present invention.

FIG. 1 is a system block diagram of a wafer probe system incorporating an autoloader designed according to one embodiment of the present invention. The system 2 includes a prober 4, which includes the prober-to-test head interface (autoloader) assembly 6, which, according to one embodiment of the present invention, comprises a probe card. Prober 4 contains mechanical elements for moving wafers into position for testing, and various associated testing and control electronics of the type known to those of skill in the art. Autoloader 6 serves as an interface between prober 4 and a test head 8.

Attached to test head 8 is what is commonly referred to in the industry as a "Pogo® stack" (not shown). The Pogo® stack comprises "Pogo® pins" which make contact with the wafer probe card being used, and are the means by which signal are applied to and dam retrieved from the probe card. In order to be coupled to the Pogo® pins, the probe card must be positioned with respect to test head 8. When in position, the probe card, with metallic pins extending downwards, is then made to come into contact with a wafer (not shown) and appropriate signals are applied thereto. The responses of the various dies on the wafer are then monitored and recorded.

Test head 8 is connected by various conductors 10 to a tester 12. Tester 12 contains the necessary computer processing facilities to direct the application of test signals to the wafer or device under test (DUT), and further to record and interpret the responses of the wafer to the signals.

In specific embodiments of the present invention, the prober-to-test head interface system comprises a transport assembly which positions the carriage conveyed probe card into a working test position.

Figure 2:
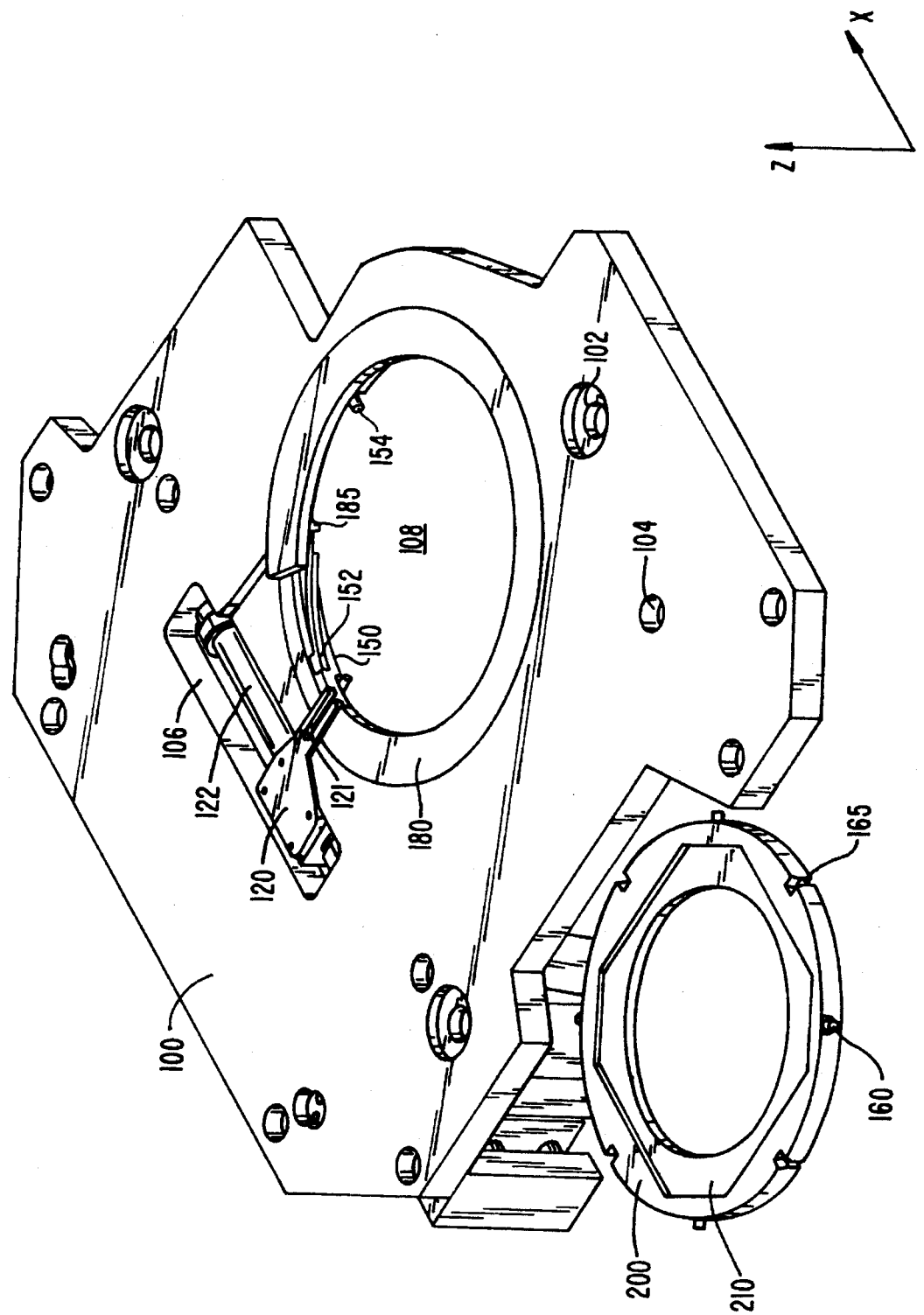
FIG. 2 is a top view of the autoloader prober-to-test head interface assembly.
Figure 3:
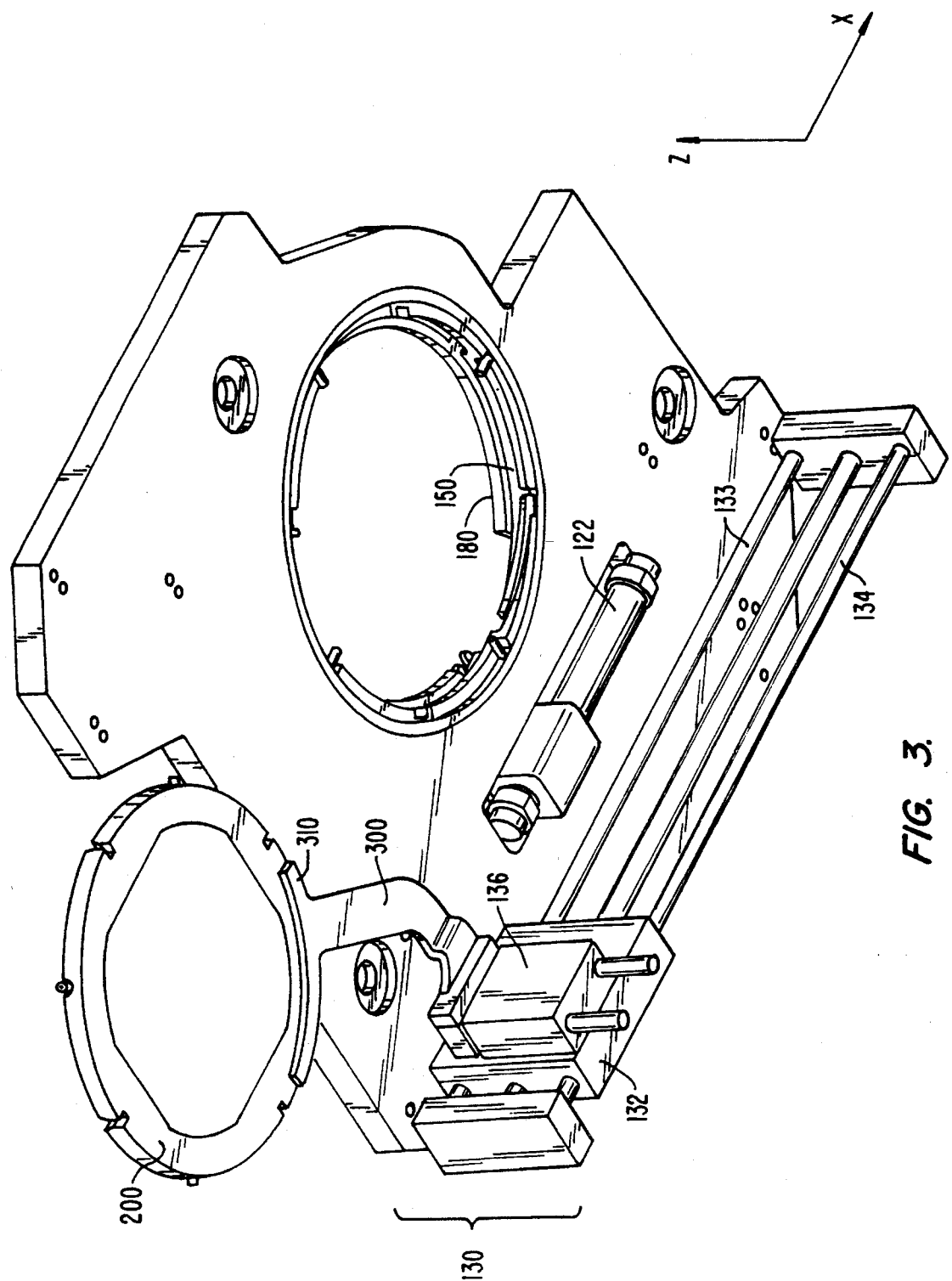
FIG. 3 is a bottom view of the autoloader prober-to-test head interface assembly.

FIGS. 2 and 3 depict different views of the prober-to-test head interface system, FIG. 2 being a top view, and FIG. 3 being a bottom view. In the embodiment shown in FIG. 2, a platform 100 is provided having a cutout slot 106 and a circular throughhole 108. Also through platform 100 are cutouts 102 to allow attachment of platform 100 to corresponding receptacles in the prober. For example, existing mounts such as Teradyne® "bowling pin" test head docking hardware will mount in pockets 104 in platform 100. Slot 106 allows movement of a cam positioner 120 along a cam-locking cylinder 122.

In operation of the embodiment shown in FIGS. 2 and 3, cam ring positioner 120 mechanically engages cam ring 150 by providing a slot to hold cam positioner pin 121. Theta ring 180 is adjacent and substantially concentric with cam ring 150 which is provided with cam grooves 152. Co-operating with cam ring 150 is carriage element 200, shown in FIG. 2 in the "start" position near one edge of platform 100. Carriage 200 is preferably substantially circular in shape and is provided on one side with a recession 210 geometrically shaped to correspond to the shape of one of a plurality of probe cards (not shown) of a well known type. Within recession 210 and substantially concentric with carriage 200 is a cutout allowing for exposure of test pins when the probe card is placed into recession 210. Carriage 200 is further provided with a plurality of cam followers 160 protruding outward along the perimeter of carriage 200. Further provided on the perimeter is a plurality of anti-theta slots 165.

According to the present invention, when carriage 200 is moved from the start position into a position under and substantially concentric with cam ring 150, dowel pins, one of which is shown as element 154 in FIG. 2, are received in anti-theta slots 165. As cam ring 150 rotates, carriage 200 is raised a distance of approximately ⅛" due to cam followers 160 tracking in the upwardly sloping cam ring grooves 152.

Referring still to FIG. 2, cam-locking cylinder 122 is a rodless air cylinder which is connected to cam ring 150, and rotates the cam ring in a clockwise direction, when actuated, to force carriage 200 against a Z-stop element on theta ring 180. Preferably, cam-locking cylinder 122 has sufficient stroke to accommodate the full preferred 33° of rotation, plus an additional 5° of rotation to account for theta ring rotation and manufacturing tolerances. In a specific embodiment, cam-locking cylinder 122 produces sufficient force through cam ring 150 and carriage 200 to compress as many as 1320 pins in a 512 I/O tester. This requires in excess of 500 lbs. of force in the Z-direction.

Referring now to FIG. 3, a view of the major features of the prober-to-test head interface from the opposite side of that shown in FIG. 2 may be seen. In this embodiment, carriage 200 is connected to positioning means 130 via arm 300 having arm attachment surface 310. Arm attachment surface 310 may include an air cylinder operated pin, thereby being detachably connectable to carriage 200. In this way, selective attachment and detachment of the carriage from the arm is facilitated.

In accordance with the present invention, carnage 200 is positioned through appropriate instructions to mate with cam ring 150 by a carriage positioning means. In the embodiment shown in FIG. 3, the carriage positioning means comprises an rodless air cylinder 132 for movement in the X-direction, and a smaller air cylinder 136 for positioning carriage 200 in the Z-direction.

Figure 4A:
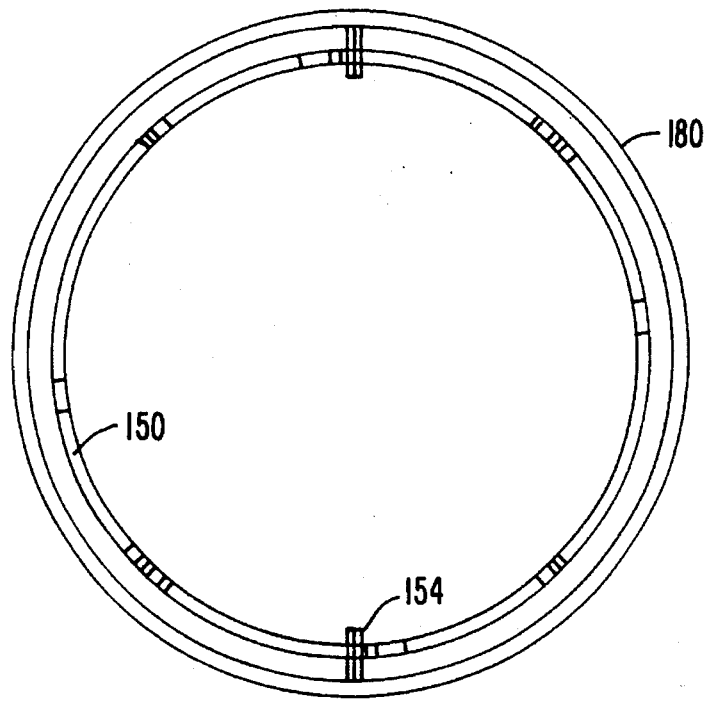
FIG. 4a shows the cam ring in top view.

FIG. 4a is a bottom view of theta ring 180 and cam ring 150, wherein major features are depicted. Theta ring 180 is preferably a rigid metallic ring into which cam ring 150 fits, and which further defines the zero location in X, theta, and Z directions. In the embodiment shown here, pins 154, oriented radially (i.e., facing inward) in theta ring 180, are provided to engage corresponding slots in carriage 200 to more precisely define the zero location in the X, Y, and theta directions, as well as provide angular stability (anti-theta) for carriage 200 during actuation of cam-locking cylinder 122. Additionally, theta ring 180 is provided with a lip (not shown) around the inside of the ring protruding inwardly towards the center of the ring which may conveniently provide a stop for the upper edge of carriage 200, thus defining more precisely the zero location in the Z-direction.

Figure 4B:
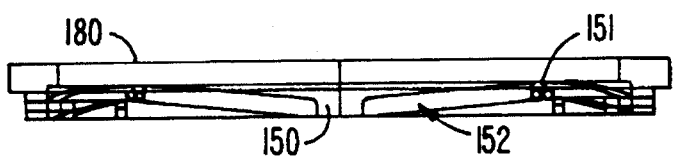
FIG. 4b shows the cam ring in side elevation view.

FIG. 4b shows cam ring 150 inside a transparent theta ring 180 in side elevation view with cam grooves 152 depicted.

Figure 4C:
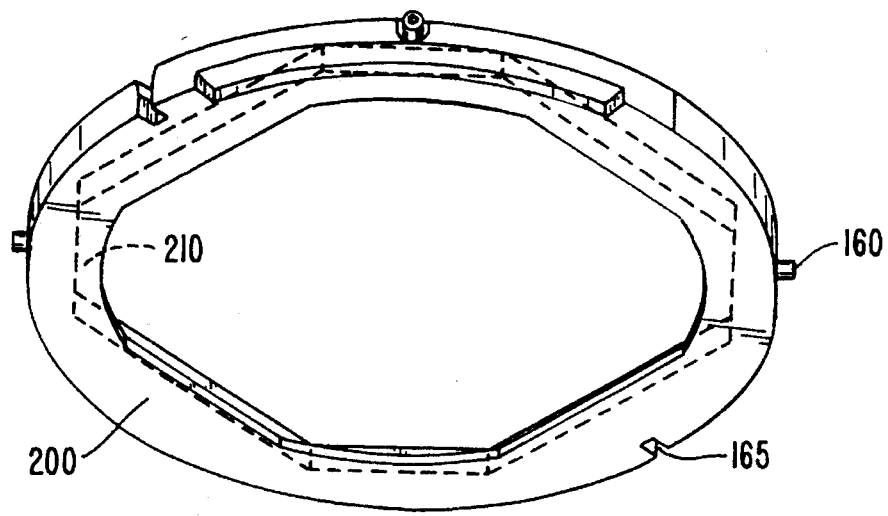
FIG. 4c depicts the carriage element in top angled view with cam follower elements shown.

FIG. 4c depicts carriage 200 in top angled view with cam follower elements 160 shown. Also shown are dowel pin receiving slots 165 located about the perimeter of carriage 200. Carriage 200 is the element which is adapted to receive probe cards. The operator conducting device tests places a probe card of a well known type into the carnage. Probe cards may already be mounted in a standard OEM supplied stiffener or the like, which corresponds geometrically with depression 210 in carriage 200.

In accordance with the present invention, carriage 200 provides enhanced support to the probe card during device testing and facilitates transport of the probe card in and out of the working position in the prober. Carriage 200 comprises a plurality of cam followers, preferably three, spaced substantially equidistant about its perimeter. Carriage 200 itself is preferably made of aluminum.

In a specific embodiment, carnage 200 is sized to accommodate probe cards with OEM supplied standard stiffeners comprising an overall diameter of up to about 10 inches. However, it will be recognized that a larger carriage may be incorporated into the present invention to accommodate other commercially available probe cards having larger diameters.

Figure 5:
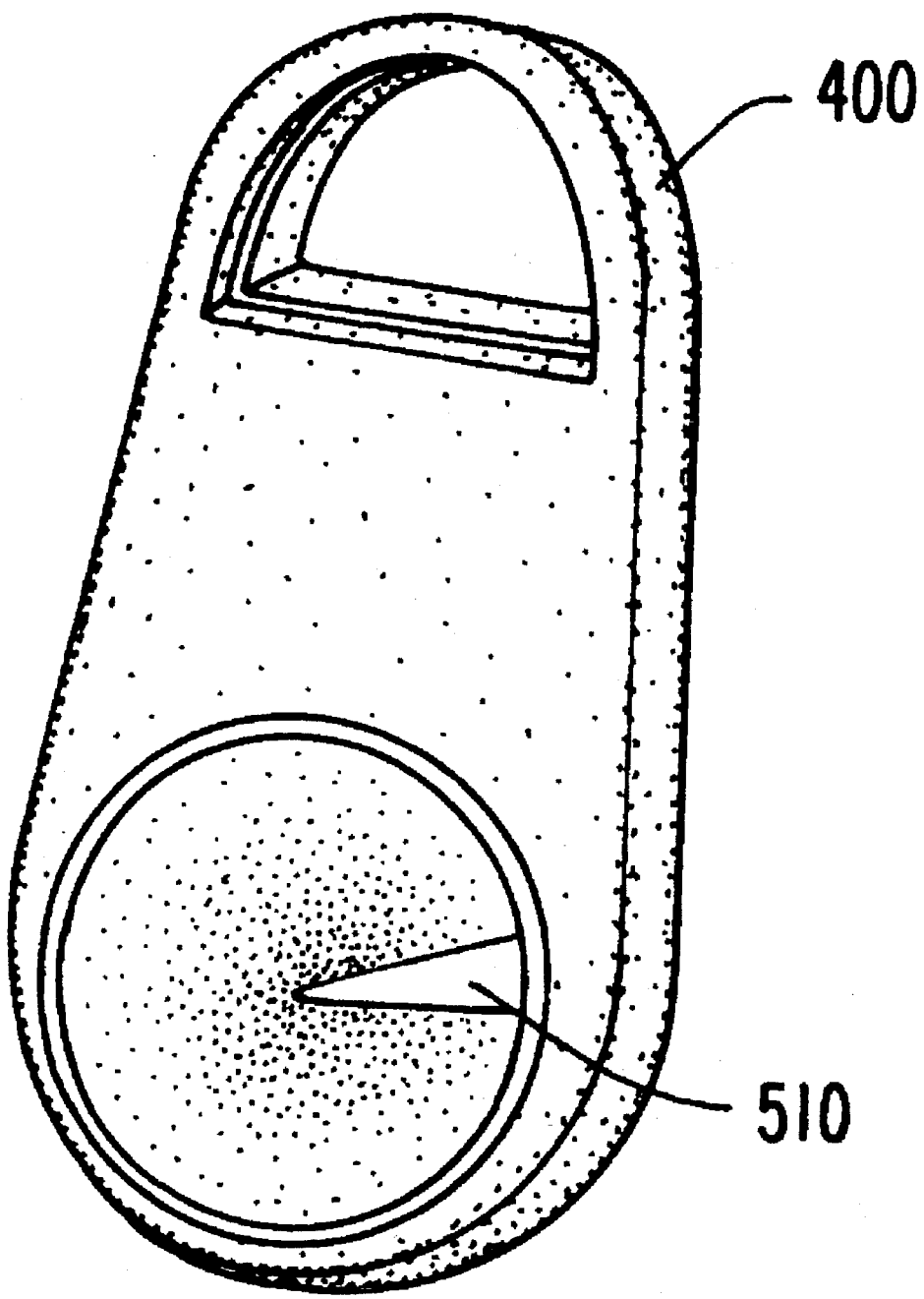
FIG. 5 depicts a key element including a memory device designed according to the present invention.

The system and method of the present invention also comprise a probe card data collection system. FIG. 5 depicts one type of "key" element 400 comprising a memory cell 410 which is employed in one embodiment of the present invention. In a more specific embodiment, the memory cell is a serial touch memory cell.

In a specific embodiment, the individual probe cards are each provided with a corresponding memory. In a more specific embodiment, the memory is writable. In a still further embodiment, the memory is also readable. The memory is mounted on a rigid or semi-rigid material to form key element 400, and is computer coded to mate with the probe card with which it corresponds. The memory may comprise erasable memory such as static random access memory (SRAM), or dynamic random access memory (DRAM) backed up by a power source, e.g., a battery. It should be apparent that write-only memories also may be used in some embodiments.

Since the key element memory is coded to an individual probe card, probe card performance and usage data may be easily tracked. A memory device which is useful for such an application is Dallas Semiconductor's DS 1994. The DS1994 is a serial touch memory which may be placed in a key element, or "key fob", such as model DS9093, also available from Dallas Semiconductor. It will be apparent, however, that a wide variety of storage devices may be used without departing from the scope of the invention. Such memory devices may be placed in a "can" on the key element with one electrical contact used for data transfer and another contact used for ground. In a specific embodiment, when the key element is inserted into the control unit, data are loaded onto and read from the memory device serially via a single data pin. The single data pin contacts a large surface of the memory cell. Accordingly, precise alignment to the memory is not required in this particular embodiment. Alternative embodiments may, however, provide for data transfer to and from the memory via a more conventional multi-pin connector. Ground may be provided via the control unit and an additional contact on the key element.

A variety of operational data about the probe card in the loader may be written to memory from a controller which is located in the transport assembly, via a memory cell data transfer device. Table 1 lists various types of operational data which may be recorded in the memory cell along with the source of the data.

TABLE 1

| Overational Data | Source of Data |
| --- | --- |
| Touchdowns | Loading assembly |
| Serial number | Input @ PC maint. station |
| Date of last maintenance | Input @ PC maint. station |
| Date of manufacture | Input @ PC maint. station |
| Failure nature of probes | Tester |
| Location of failed probes | Tester |
| Operators' I.D. | Loading assembly |
| Scheduled maintenance date | Input @ PC maint. station |
| Scheduled maintenance touchdowns | Input @ PC maint. station |
| Previous theta location | Input @ PC maint. station |

In one embodiment, a real time clock is incorporated into the key element for recording the times at which the corresponding probe card is used, as well as for recording the times when the probe card is checked or repaired.

The memory described above with respect to various embodiments is useful for storing information about the number of times a particular probe card has made contact with wafers (touchdowns) since it was last serviced. Other important information which may be stored in the memory includes the number of failed contacts of individual or groups of probes and their locations, the probe card serial number, the date of the card's last maintenance, or the like. The memory feature described herein allows the system user to read maintenance information for a particular probe card by means of a separate device, thereby enabling the user to identify probe cards which have been used extensively or which have exhibited unacceptable failure rates. In this way, probe cards which should be serviced or replaced may be easily identified.

According to one embodiment of the present invention, an operator selects a probe card to conduct a device test in the prober. The operator removes the probe card from its storage box and places it into carriage. Associated with the selected probe card, and preferably contained in the same storage box, is a key element with a memory cell. The operator inserts the key element into the prober, and when the probe card data is verified, the carriage positioner is activated to transport the probe card and carriage into the working test position. During this operation, the data associated with the specific probe card is updated and, when testing is complete, the data is stored in its updated form in the memory cell. Upon completion of the testing operations, the probe card and the key element are removed and replaced in the storage box.

The prober-to-test head interface system is operated by initiating a series of steps as described in detail below. Initially, the operator places a probe card, which may be disposed in an OEM stiffener, into the carriage which is connected to the protruding arm. The operator then actuates the system, in one embodiment via a remote control unit, to initiate the transport sequence.

The arm is transported by the carriage positioning means in the positive X-direction (as defined by FIGS. 2 and 3) to a predetermined position directly below the cam ring assembly. In one embodiment, a second air-driven slide then orients the carriage in the positive Z-direction to engage the cam followers in the cam grooves on the interior of the cam ring assembly. The cam-locking cylinder is then actuated to cause the cam ring to rotate, lifting the carriage from the arm through the action of the cam followers in the cam grooves, thereby bringing the probe card disposed in the carriage in contact with the test head. With the carriage and associated cam followers securely fixed in the cam ring assembly, the arm is then free to travel in the negative Z-direction via actuation of the Z-slide. The arm then travels in the negative X-direction until clear of the cam ring area which, in one particular embodiment, is approximately one-half the distance to the start position. Thus, during wafer testing, the arm is removed from the wafer testing area. This is accomplished in a further embodiment by raising the arm in the Z-direction and pocketing the arm in a cutout depression in the ring carrier (not shown).

Following wafer testing, the operator initiates removal of the probe card, in one embodiment, by means of a command on a remote control unit. According to a specific embodiment, the arm travels in the negative Z-direction out of the depression described above. The arm then travels in the positive X-direction until it is again positioned directly below the cam ring assembly. The arm then travels in the positive Z-direction and attaches to the carriage holding the probe card, the carriage having been lowered from the test position by reverse rotation of the cam ring. The arm with carriage and probe card attached travels in the negative Z-direction, and then in the negative X-direction back to the start position, thereby providing operator access to the probe card.

Figure 6A:
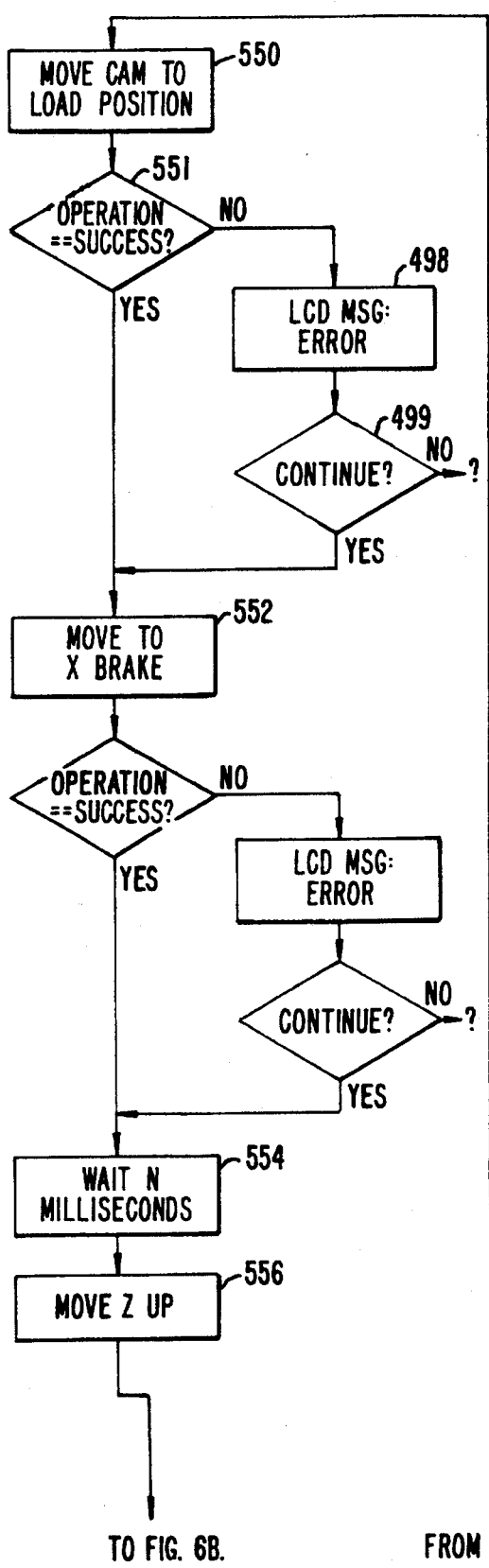
FIGS. 6a through 6h provide a flowchart illustrating the operation of a system incorporating one embodiment of the prober-to-test head interface system.
Figure 6A:
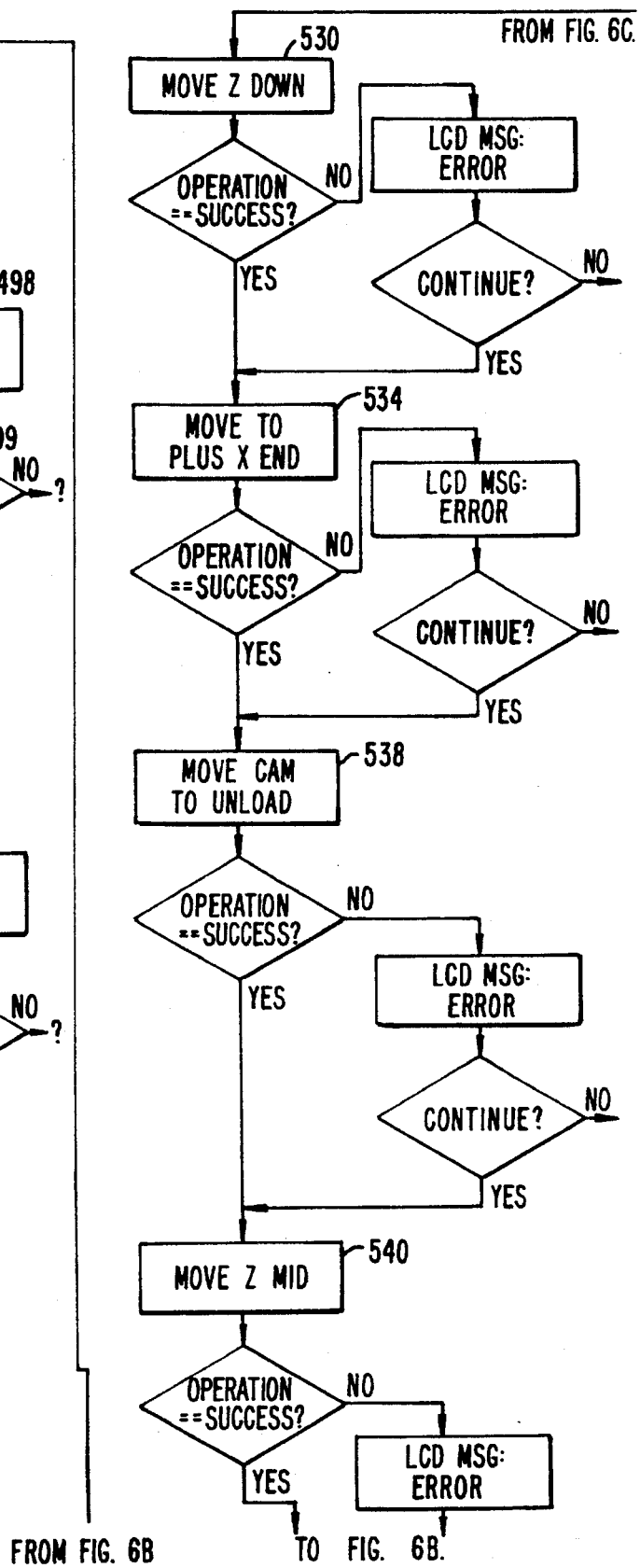
Figure 6B:
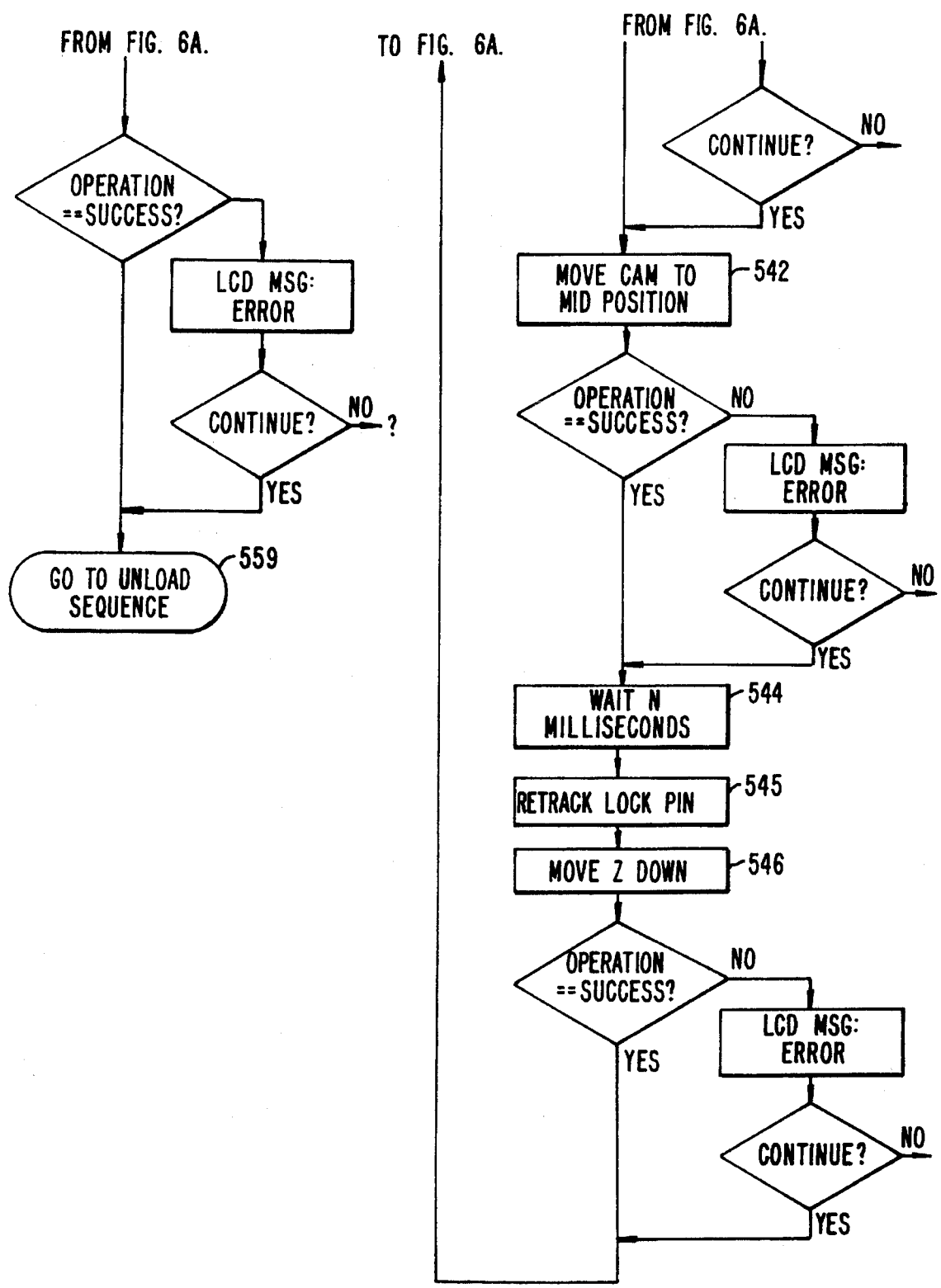
Figure 6C:
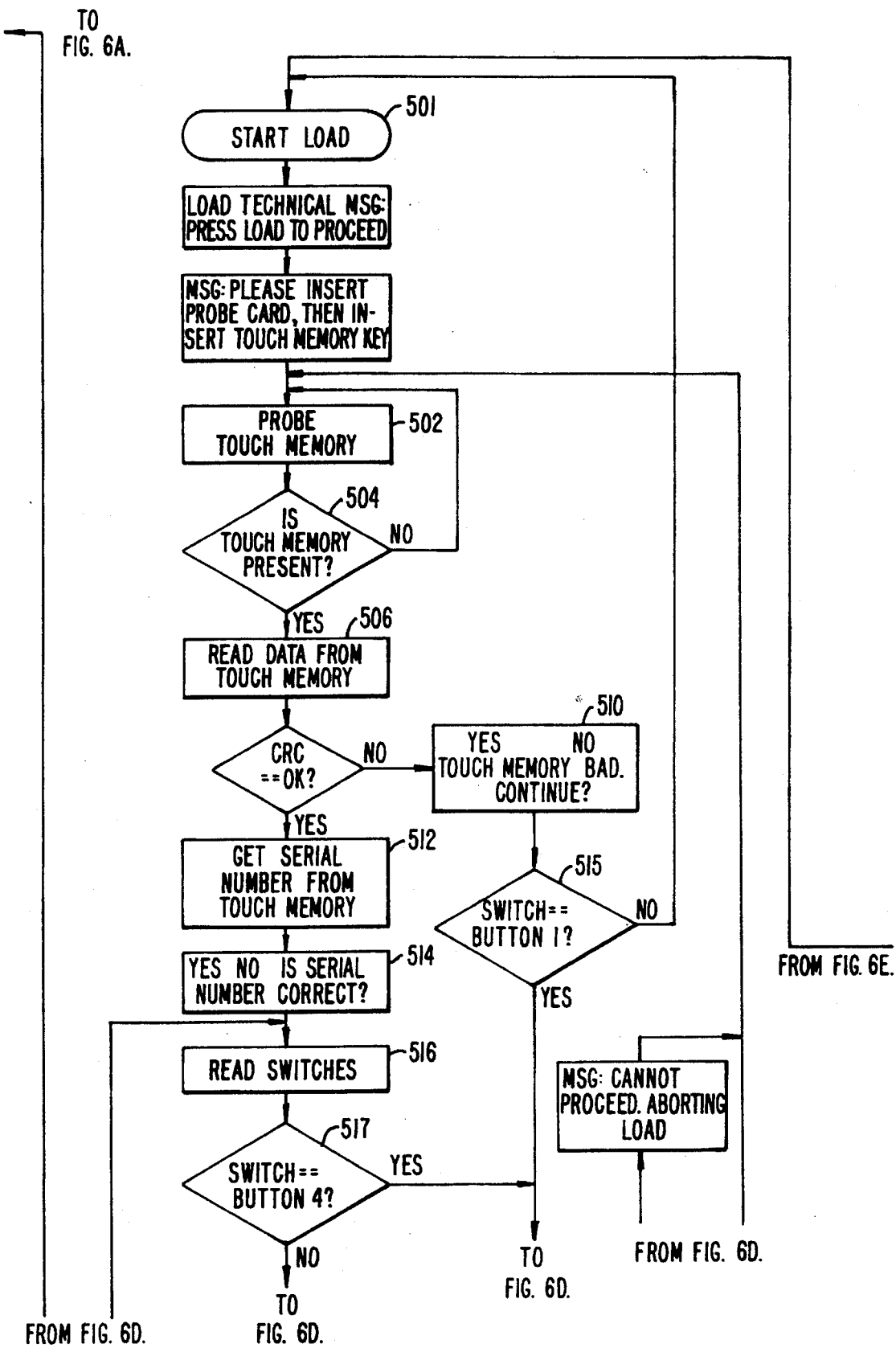
Figure 6D:
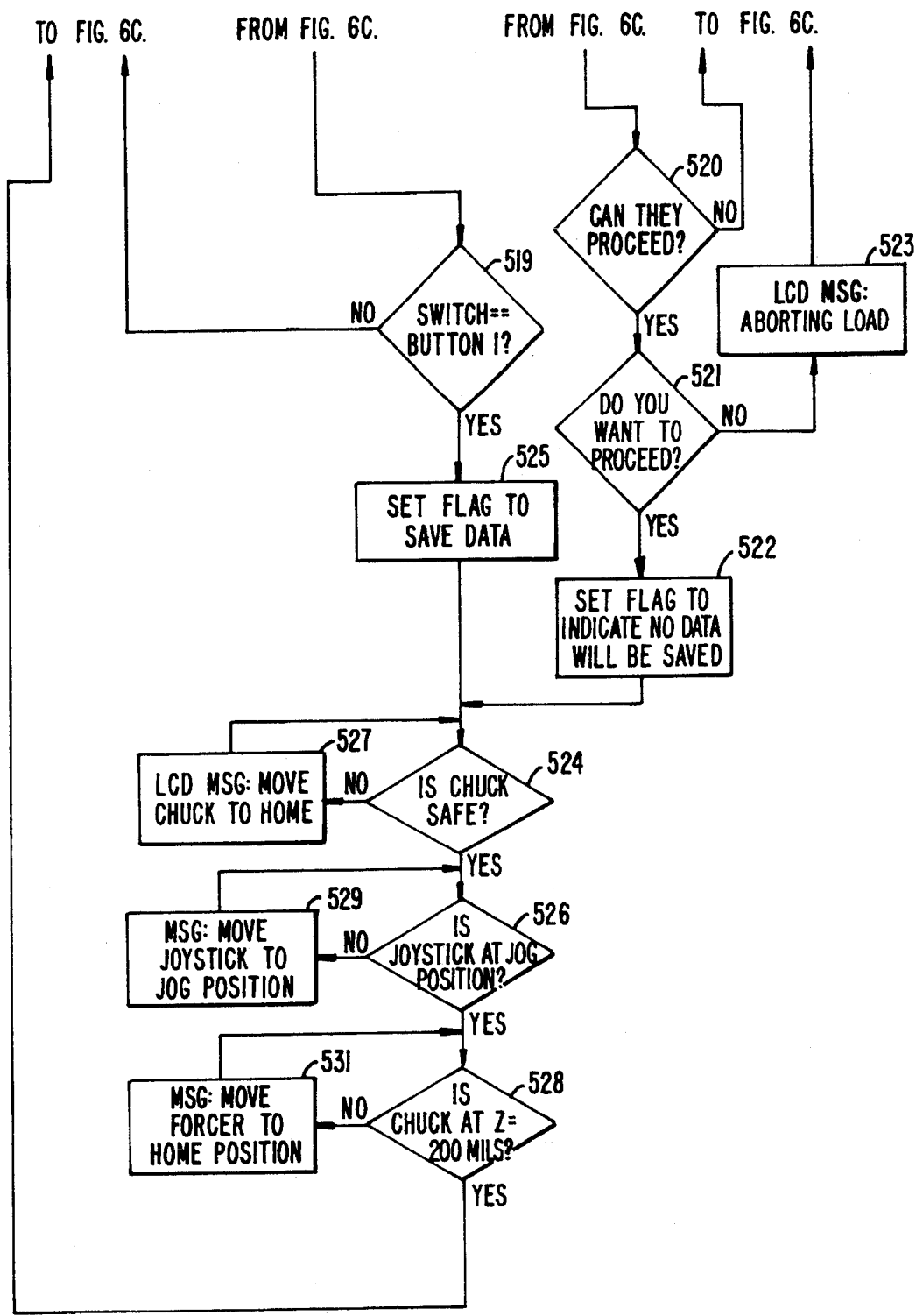
Figure 6E:
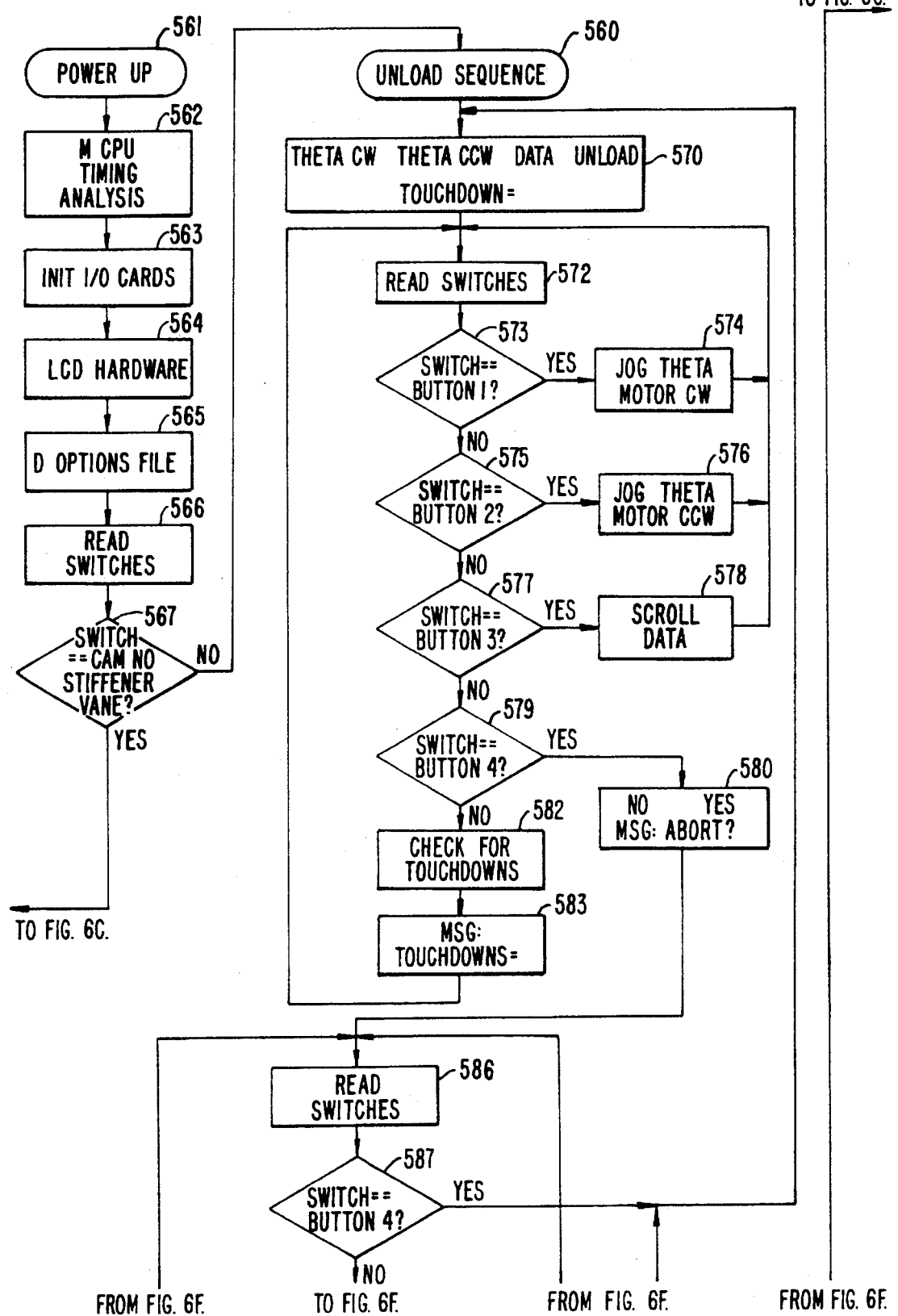

In FIGS. 6a through 6h, a process for operating the autoloader according to one embodiment of the present invention is depicted in a logical flowchart. Referring first to FIG. 6e, the autoloader system is powered up according to a sequence well known to those skilled in the art. At step 561 the system is turned on; at 562 through 566 the system initializes input and output cards, checks the LCD and other auxiliaries, and queries at step 567 whether the carriage is present at the end of the arm.

At step 501 (FIG. 6c), a start sequence is initiated and a message is displayed prompting the operator to indicate the desire to start up by pressing an identified switch. The system then prompts the operator to insert the probe card into the carriage and the serial touch memory key into the designated receptacle for verification.

At step 504 the system queries whether the touch memory is present and if so proceeds to read data from the touch memory at step 506. If the data is readable, the system retrieves information including the serial number of the probe card from the touch memory at step 512, and then verifies the information at step 514. If the retrieved data from the touch memory corresponds to the serial number and identification of the particular probe card, the system queries whether data is to be saved for the present test. At step 524, the system checks whether the forcer is in a safe position and if not, prompts the operator with a message to the effect that the forcer should be moved to the home position, as depicted in step 527. The forcer is a movable assembly in the prober upon which the wafer chuck is disposed, and is the means by which wafers to be tested are positioned and brought into contact with probe card test pins.

Provided the forcer is safe at step 526, the system checks whether the joy stick is at the jog position. If the joy stick is not at the jog position, the system prompts the operator at step 529 to place the joy stick at the jog position. Once the forcer is in the proper location, the system proceeds at step 530 (FIG. 6a) to move the carriage and arm in the negative Z-direction. Once the arm and carriage are in the down Z position, the system proceeds at step 534 to move them to the positive X terminus of the slide.

The cam ring is directed at step 538 to move to the "dock" position, followed by an instruction at step 540 to move the carriage to the mid-Z position. With the carriage at the mid-Z position, the cam ring is instructed at step 542 (FIG. 6b) to move to the mid-cam position. The autoloader then pauses at step 544 for about n milliseconds before retracting the lock pin at step 545. The arm is then moved at step 546 in the negative Z direction.

Assuming successful movement of the arm down in the Z direction, the system proceeds to instruct the cam ring to rotate to the load position at step 550 (FIG. 6A). At step 551, the system queries whether the carriage was successfully loaded into the cam ring, before instructing at step 552 to move the arm to the X brake position. After waiting a predetermined period, the arm is instructed at step 556 to move in the positive Z direction, keeping it out of the way during device testing. The system then waits at unload sequence initiation (step 559, FIG. 6b).

Referring now to FIG. 6e and step 560, the system initiates the unload sequence at the end of device testing. At step 570, data regarding thetas and touchdowns are recorded. The probe card is returned to the zero theta position and if prompted by the operator at step 577, the data is scrolled on the display. If information regarding the number of touchdowns is desired, a button is queried at step 579 to check for touchdowns and display the message (steps 582 and 583).

Figure 6F:
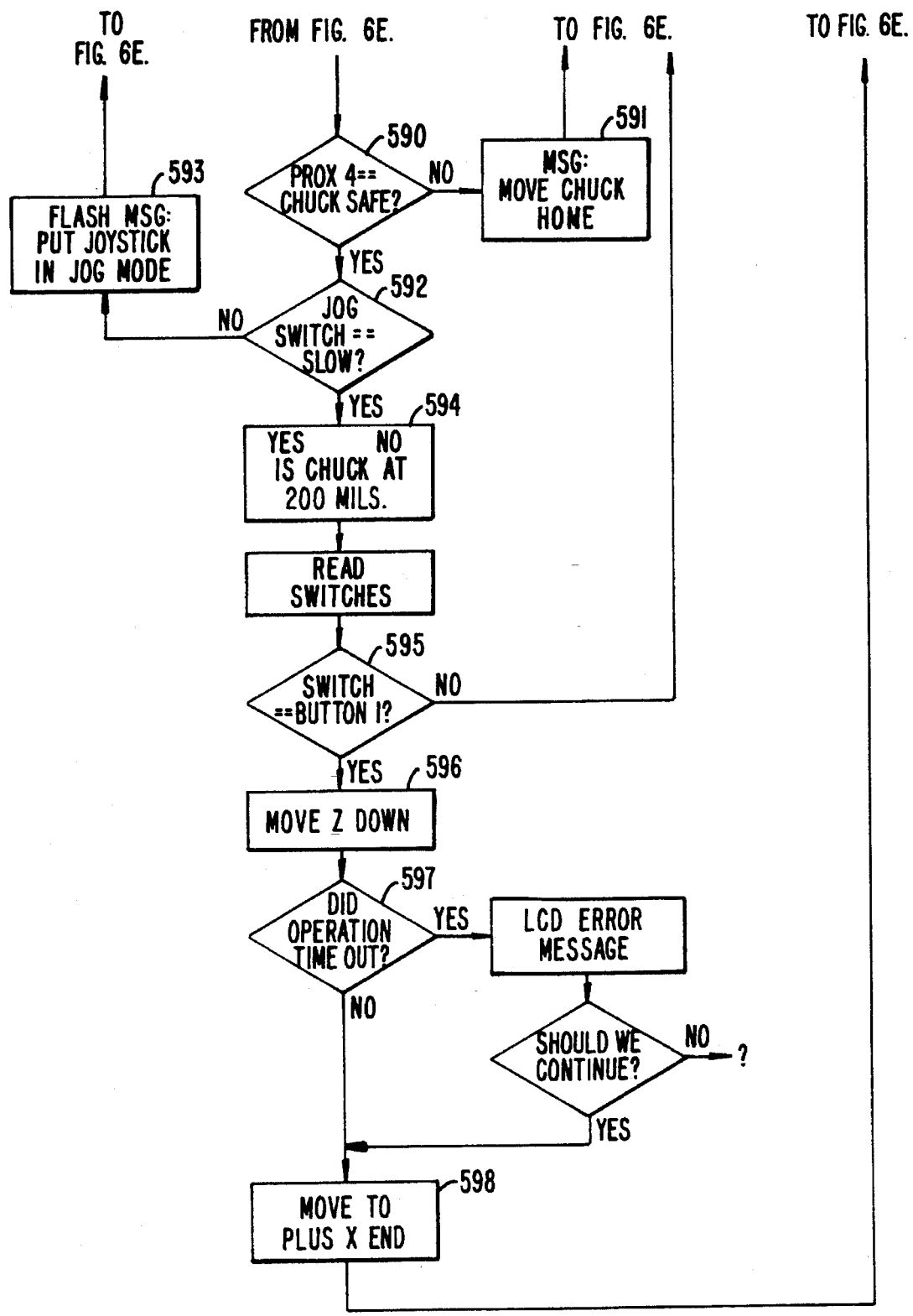

If no additional present test information is desired by the operator, the system checks the proximity of the forcer at step 590 (FIG. 6f). If the forcer is not "safe", a message is displayed at step 591 to move the forcer to the home position. When the forcer is verified safe, the process proceeds to steps 592 and 593 wherein the operator is prompted to place the joy stick in the jog mode if the joy stick was not already in jog mode. The joy stick is a part of the prober which is used by the operator to direct the motion of the chuck when the prober is in manual mode.

The arm is then instructed to move in the negative Z-direction from the retracted position which resulted from step 556 (FIG. 6a). If the arm movement is accomplished in a predetermined time period (step 597), it is instructed at step 598 to move to the positive X end of the slide.

Referring now to step 600 (FIG. 6g), the system then waits to determine if the arm was successfully placed in the positive X position. The cam ring is then instructed at step 602 to move to the mid-cam position. If successful, the lock pin is retracted at step 604 and the arm is moved to the mid-Z position at step 606.

Figure 6G:
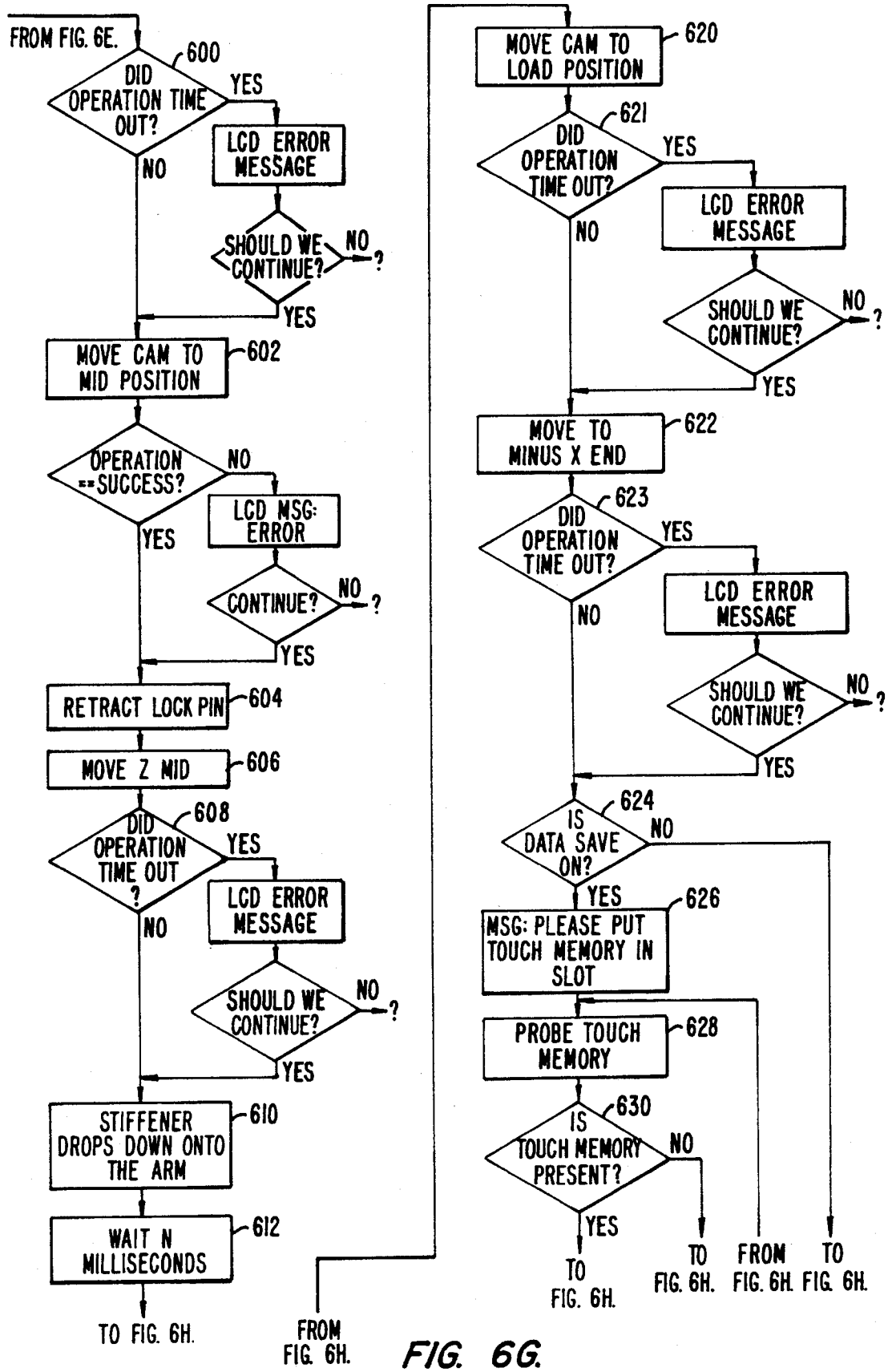

Assuming successful position of the arm, at step 610, the carriage, also referred to in FIG. 6g as the arm, engages the "stiffener". Waiting a predetermined time period at step 612, the system engages the lock pin to attach the carriage to the arm at step 614. Thereafter, at step 616, the cam ring moves to the "dock" position. When the cam ring is successfully out of the way, the arm with carnage is instructed to move in the negative Z direction at step 618 and is verified at step 619.

Figure 6H:
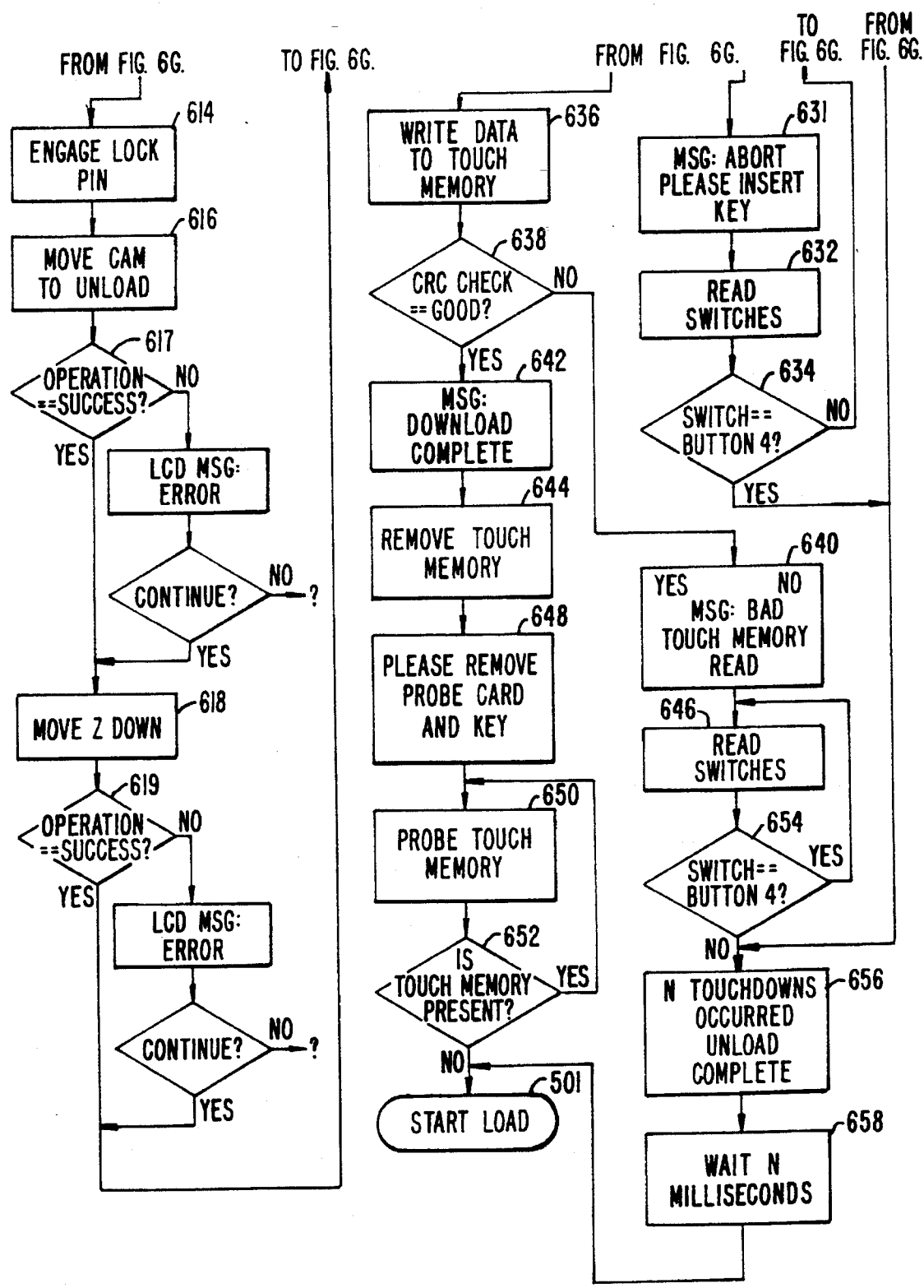

Referring again to FIG. 6g, at step 620, the cam ring moves to the load position and is verified at step 621. At step 622, the arm and carriage move to the negative X end of the slide, the accomplishment of which is verified at step 623. At step 624 the system queries whether the DATA SAVE option is on. If the DATA SAVE option is on, a message is displayed for the operator to place the touch memory key into the receptacle. The system confirms whether the touch memory is present at step 630. If the touch memory is not present, the system prompts the operator to insert the key at step 631 (FIG. 6h).

Once the touch memory is present, the system writes the data from the present test to the memory at step 636, and confirms its recordation at step 638. If successfully recorded, a message is displayed at step 642 that the unloading sequence is complete and for the touch memory to be removed at step 644 along with probe card and key at step 648. When all items have been removed, the system cycles to the wait mode at step 501 (FIG. 6c).

The above description is illustrative and not restrictive. Many variations of the invention will become apparent to those of skill in the art upon review of this disclosure. Geometries of the individual elements my vary, and thus are not shape restricted. A wide variety of circuit elements could be utilized in place of those described herein. Moreover, it will be apparent that circuit elements could be replaced with software functionality, or, conversely, that software functionality could be replaced with circuit elements.

The scope of the present invention should, therefore, be determined not with reference to the above description, but instead should be determined with reference to the appended claims along with their full scope of equivalents.

What is claimed is:

1. A prober-to-test head interface system, comprising:
   a carriage having a plurality of cam followers on the perimeter of said carriage;
   a cam ring having a plurality of cam grooves on the interior of said cam ring;
   positioning means detachably coupled to said carriage for positioning said cam followers in said cam grooves; and
   rotating means coupled to said cam ring for rotating said cam ring, thereby causing said cam followers to track in said cam grooves and move said carriage in a direction substantially perpendicular to the plane of said cam ring, said rotating means comprising a theta ring substantially concentric with and adjacent said cam ring for finely adjusting the angular positioning of said carriage with respect to the orientation of a device under test.

2. The system as recited in claim 1 wherein said positioning means comprises:
   an arm detachably coupled at a first end to said carriage;
   a first air cylinder coupled to a second end of said arm for moving said carriage in a direction substantially parallel to the plane of said cam ring; and
   a second air cylinder coupled to said second end of said arm and said first cylinder for moving said carriage in a direction substantially perpendicular to the plane of said cam ring.

3. The system as recited in claim 2 wherein said arm is pin connected to said carriage.

4. The system as recited in claim 2 wherein said first cylinder comprises a band-type cylinder, and said second cylinder comprises a conventional air cylinder.

5. The system as recited in claim 1 wherein said rotating means comprises a cam-locking cylinder coupled to said cam ring for rotating said cam ring when said cam-locking cylinder is actuated.

6. The system as recited in claim 5 wherein said cam-locking cylinder comprises a rodless-type air cylinder.

7. The system as recited in claim 5 wherein said cam-locking cylinder is supplied with a predetermined supply air pressure to maintain a substantially constant rotational force on said cam ring thereby maintaining the position of said carriage.

8. The system as recited in claim 7 wherein said predetermined air pressure is at least 65 psig.

9. The system as recited in claim 1 wherein said positioning means comprises means for moving said carriage in directions both substantially parallel and substantially perpendicular to the plane of said cam ring thereby facilitating the loading and unloading of probe cards into the system.

10. The system as recited in claim 1 further comprising a probe card disposed in said carriage.

11. The system as recited in claim 10 wherein said probe card is disposed in a stiffener.

12. A prober-to-test head interface system, comprising;
   a carriage having a plurality of cam followers on the perimeter of said carriage;
   a cam ring having a plurality of cam grooves on the interior of said cam ring;
   positioning means detachably coupled to said carriage for positioning said cam followers in said cam grooves, said positioning means comprising:
      an arm detachably coupled at one end to said carriage;
      a first air cylinder coupled to another end of said arm for moving said carriage in a direction substantially parallel to the plane of said cam ring; and
      a second air cylinder coupled to said another end of said arm and said first cylinder for moving said carriage in a direction substantially perpendicular to the plane of said cam ring;
   rotating means coupled to said cam ring for rotating said cam ring, thereby causing said cam followers to track in said cam grooves and move said carriage in a direction perpendicular to the plane of said cam ring, said rotating means comprising:
      a cam-locking cylinder coupled to said cam ring for rotating said cam ring when said cam-locking cylinder is actuated, and
      a theta ring concentric with and adjacent said cam ring for finely adjusting the angular positioning of said carriage with respect to the orientation of a device under test.

13. The system as recited in claim 12 wherein said cam-locking cylinder is supplied with a predetermined supply air pressure to maintain a substantially constant rotational force on said cam ring thereby maintaining the position of said carriage.

14. The system as recited in claim 13 wherein said predetermined air pressure is at least 65 psig.

15. The system as recited in claim 12 further comprising a probe card disposed in said carriage.

16. The system as recited in claim 15 wherein said probe card is disposed in a stiffener.

17. A method of testing a semiconductor wafer in a prober tester comprising the steps of:
   positioning a carriage having a probe card disposed therein and a plurality of cam followers on the perimeter of said carriage in a cam ring having a plurality of cam grooves located on the interior of said cam ring to engage said cam followers in said cam grooves, the probe card having a plurality of test pins;
   rotating said cam ring, thereby causing said cam followers to track in said cam grooves and move said carriage in a direction perpendicular to the plane of said cam ring, thereby coupling said probe card to a test head;

rotating a theta ring coupled to said cam ring, thereby finely adjusting the angular position of said carriage with respect to the orientation of a device under test;

positioning the semiconductor wafer such that said test pins make contact with the semiconductor wafer; and probing the semiconductor wafer.

18. The method as recited in claim 17 further comprising the steps of:

placing a probe card into said carriage;

causing said carriage to move in a direction substantially parallel to the plane of said cam ring from a position outside of the prober tester to a position inside the prober tester; and causing said carriage to move in a direction substantially perpendicular to the plane of said cam ring.

19. The method as recited in claim 17 further comprising the steps of:

placing a key comprising a memory corresponding to said probe card in a control unit; and polling said memory to modify or read information stored in said memory.

20. The method as recited in claim 19 wherein said memory is a serial touch memory.

21. The method as recited in claim 17 wherein said probe card further comprises auxiliary electronic devices protruding at least one-half of one inch in the direction perpendicular to the plane of said cam ring from said probe card.

* * * * *